(12) United States Patent
Shin et al.

(10) Patent No.: US 9,576,916 B2
(45) Date of Patent: Feb. 21, 2017

(54) HIGH FREQUENCY CIRCUIT COMPRISING GRAPHENE AND METHOD OF OPERATING THE SAME

(75) Inventors: Hyeon-jin Shin, Suwon-si (KR); Jae-young Choi, Suwon-si (KR); Seong-chan Jun, Seoul (KR); Whan-kyun Kim, Seoul (KR); Hyung-seo Yoon, Seoul (KR); Ju-yeong Oh, Gimpo-si (KR); Ju-hwan Lim, Seoul (KR)

(73) Assignees: SAMSUNG ELECTRONICS CO., LTD., Gyeonggi-do (KR); INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 0 days.

(21) Appl. No.: 13/543,050

(22) Filed: Jul. 6, 2012

(65) Prior Publication Data
US 2013/0175676 A1 Jul. 11, 2013

(30) Foreign Application Priority Data

Jul. 8, 2011 (KR) .................. 10-2011-0067971

(51) Int. Cl.
*H01L 23/66* (2006.01)
*H01L 23/532* (2006.01)
*H01L 27/04* (2006.01)

(52) U.S. Cl.
CPC ......... *H01L 23/66* (2013.01); *H01L 23/53276* (2013.01); *H01L 27/04* (2013.01); *H01L 2223/6627* (2013.01); *H01L 2924/0002* (2013.01)

(58) Field of Classification Search
USPC ........................................... 257/664
See application file for complete search history.

(56) References Cited

U.S. PATENT DOCUMENTS

| 7,723,684 | B1* | 5/2010 | Haddon et al. ............. 250/338.1 |
| 2008/0218142 | A1* | 9/2008 | Uehara .......................... 323/282 |
| 2009/0155578 | A1 | 6/2009 | Zhamu et al. |
| 2009/0320911 | A1 | 12/2009 | Ruoff |
| 2010/0140723 | A1* | 6/2010 | Kurtz et al. ................... 257/415 |
| 2010/0207254 | A1* | 8/2010 | Jain ....................... H01L 31/105 257/629 |
| 2010/0214034 | A1* | 8/2010 | Peng et al. .................... 331/154 |

(Continued)

FOREIGN PATENT DOCUMENTS

JP  2010-245797 A  10/2010

OTHER PUBLICATIONS

Lin, et al., Dual Gate Graphene FETs with ft of 50 GHz, pp. 1-11, (2009 in Google Search) This work is supported by DARPA under contract FA8650-08-C-7838 through the CERA program. The authors are with IBM T. J. Watson Research Center, Yorktown Heights, NY 10598 (email: vming@us.ibm.com).

(Continued)

*Primary Examiner* — Mohammad Islam
*Assistant Examiner* — Jay C Chang
(74) *Attorney, Agent, or Firm* — Cantor Colburn LLP

(57) ABSTRACT

A high frequency circuit includes a first electronic device, a second electronic device, and a graphene interconnection unit, where at least one of a trench and a via is defined under the graphene interconnection unit.

11 Claims, 4 Drawing Sheets

(56) References Cited

U.S. PATENT DOCUMENTS

2012/0153119 A1* 6/2012 Patil .................. B82Y 30/00
250/200
2012/0175594 A1* 7/2012 Chen et al. .................. 257/29

OTHER PUBLICATIONS

Allen, et al., Honeycomb Carbon: A Review of Graphene, American Chemical Society, Downloaded by CKRN CNSLP Master on Jul. 19, 2009, Published on Jul. 17, 2009 on http://pubs.acs.org/doi: 10.1021/cr900070d, pp. A-N.

Xu, et al., Radio Frequency Electrical Transduction of Graphene Mechanical Resonators, pp. 1-10, (2011 in Google Search) These authors contributed equally to this paper. Corresponding email: jh2228@colum1bia.edu.

Sato et al., "Networked-Nanographite Wire Grown on SiO2 Dielectric without Catalysts using Metal-Photoemission-assisted Plasma-enhanced CVD", 2010 IEEE International Interconnect Technology Conference—IITC, 3 pp., 2010.

\* cited by examiner

HIGH FREQUENCY CIRCUIT COMPRISING GRAPHENE AND METHOD OF OPERATING THE SAME

CROSS-REFERENCE TO RELATED APPLICATIONS

This application claims priority to Korean Patent Application No. 10-2011-0067971, filed on Jul. 8, 2011, and all the benefits accruing therefrom under 35 U.S.C. §119, the content of which in its entirety is herein incorporated by reference.

BACKGROUND

1. Field

The present disclosure relates to a high frequency circuit including graphene and a method of operating the high frequency circuit including graphene. More particularly, the present disclosure relates to a high frequency circuit including chemically synthesized graphene with improved productivity and reproducibility.

2. Description of the Related Art

Recently, research into graphene having high current density and long travel distance of free electrons has been conducted, as a replacement of silicon or metal that has been commonly used in electronic devices. Graphene is a material having improved characteristics compared to metal, which is widely used in electronic devices, e.g., copper or aluminum. Furthermore, three-dimensional displays using high-capacity signal transmission, next generation communication devices that operates at 3 gigahertz (GHz) or higher, and semiconductor devices using materials as replacements for silicon may use signal transmission at a high radio frequency field.

SUMMARY

Provided is a high frequency circuit with improved transmission characteristics in a high frequency field.

Provided is a method of operating the high frequency circuit.

Additional aspects will be set forth in part in the description which follows and, in part, will be apparent from the description, or may be learned by practice of the presented embodiments.

According to an embodiment of the invention, a high frequency circuit includes: a first electronic device, a second electronic device, and a graphene interconnection unit which connects the first and second electronic devices, where at least one of a trench and a via is defined under the interconnection unit.

According to another embodiment of the invention, the high frequency circuit may be operated by applying a power voltage to the graphene interconnection unit, and conveying current via the graphene interconnection unit in a high frequency field.

BRIEF DESCRIPTION OF THE DRAWINGS

These and/or other features will become apparent and more readily appreciated from the following description of the embodiments, taken in conjunction with the accompanying drawings of which.

DETAILED DESCRIPTION

Figure 1A:
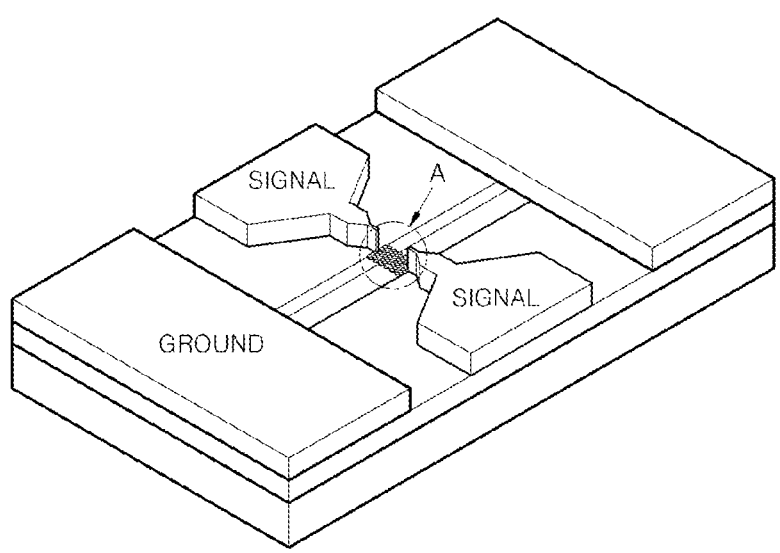
FIG. 1A is a schematic view showing a structure of an embodiment of a radio frequency ("RF") interconnection unit having a ground-signal-ground ("GSG") type electrode shape.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

A high frequency circuit is a circuit that transports current and voltage in a high frequency field. In an embodiment, the high frequency circuit may include a material having high electron mobility and high conductivity.

In an embodiment of the invention, the high frequency circuit includes graphene as an interconnection unit that connects electronic devices therein. In an embodiment, a via or a trench may be defined or provided under the graphene interconnection unit.

Graphene has a two-dimensional structure in which carbon atoms are aligned in a hexagonal ring to form a honeycomb structure. Electrons in graphene moves at least 100 times faster than electrons in monocrystalline silicon that is widely used in a semiconductor device, and the conductivity of graphene is at least 100 times higher than the conductivity of copper. Accordingly, graphene may function as the high-speed interconnection unit when the graphene is used in a high frequency circuit.

When graphene is applied to electronic devices, intrinsic properties of the graphene may deteriorate by an insulating layer disposed under the graphene due to the thickness of the insulating layer, which is similar to the diameter of a carbon atom. For example, $SiO_2$, which is generally used in an insulating layer, has a dangling bond and may cause a microscopic ripple on a surface of graphene. Properties of graphene may deteriorate due to scattering caused by charged impurities and surface optical phonons. In addition, moving charges are trapped by an insulator to cause charge loss. In an embodiment, a trench or a via by removing the insulating layer is disposed under the graphene, e.g., by etching such that the deterioration of properties of graphene due to the insulating layer are effectively prevented.

In an embodiment, a trench is disposed under the graphene interconnection unit, as shown in FIG. 1, and a size of the trench may be defined by width, length and depth thereof.

The width and length of the trench may vary according to electronic devices in which the interconnection unit is used, and the depth of the trench, as a factor influencing transmission characteristics. In an embodiment, the depth of the trench may be, for example, in the range of about 1 nanometer (nm) to about 10,000 nanometers (nm). In an embodiment, the trench may have a gradient.

In an embodiment, a single trench may be defined (e.g., provided or formed) under the graphene interconnection unit. In an alternative embodiment, a plurality of trenches may be formed under the graphene interconnection unit in an array form.

In an embodiment, the trench may be formed by removing the insulating layer disposed under the graphene interconnection unit using lithography, for example. In such an embodiment, any lithography that is commonly used in the art may be used. In an embodiment, for example, photolithography, X-ray lithography, e-beam lithography, or the like, may be used to form the trench. In an embodiment, the trench may be formed by removing a portion of the insulating layer using lithography including coating a photosensitive material on the insulating layer, irradiating light or an e-beam thereto using a mask having a predetermined shape to form a pattern, and applying an etchant such as buffered oxide etchant ("BOE") to the pattern.

In an embodiment, the insulating layer disposed under the graphene interconnection unit may include an oxide layer, such as $SiO_2$, $HfO_2$, $TiO_2$ and $ZrO_2$, a nitride layer, such as SiN and BN, or an organic insulating layer, for example. In an embodiment, the insulating layer may be disposed on a silicon substrate that is used as a base.

In an embodiment, a via may be additionally defined, e.g., formed, under the graphene interconnection unit and may have a through hole shape.

As described above, after the trench or the via is formed in the insulating layer, the graphene interconnection unit may be provided by deposition or transfer. In an embodiment, the trench may also be formed by forming the graphene interconnection unit in a pattern on the insulating layer, and then removing a portion of the insulating layer disposed under the graphene interconnection unit using lithography.

In an embodiment of the high frequency circuit, graphene of the interconnection unit may have a plurality of layers, e.g., 1 to about 300 layers, and the size and shape of the graphene may be adjusted according to electronic devices. The size of graphene may be defined by a width (w) and a length (L). In an embodiment, for example, the width (w) and the length (L) of graphene may be in a range of about 0.001 micrometer (μm) to about 1 millimeter (mm) and in a range of about 0.001 μm to about 100 μm, respectively.

In an embodiment, the graphene may be prepared using various methods, for example, a delamination process or a growth process.

The delamination process is a process including separating graphene from a material internally including a graphene structure such as graphite or highly oriented pyrolytic graphite ("HOPG") using a mechanical method (for example, a Scotch™ tape) or a redox process.

According to the growth process, carbon that is adsorbed to or contained in an inorganic material grows on a surface at a high temperature, or a gaseous carbon source is dissolved in or adsorbed to a catalyst layer at a high temperature and cooled to crystallize the carbon on a surface. In an embodiment, the graphene obtained using the growth process may have an area greater than or equal to about 1 square centimeter ($cm^2$) and a uniform shape. In an embodiment, the number of layers of the graphene obtained using the growth process may be adjusted by controlling type and thickness of a substrate or a catalyst, reaction time, cooling rate, and concentrations of reactant gases, for example. In such an embodiment, graphene manufactured using the growth process has high reproducibility and may be thereby efficiently mass-produced.

In an embodiment, the graphene obtained using the delamination process or the growth process is used in the high frequency circuit, and thus electrical properties, productivity and reproducibility of graphene may be substantially improved.

In an embodiment, the graphene interconnection unit has higher conductivity and charge mobility than a copper interconnection unit conventionally used in an integrated circuit. The graphene interconnection unit has higher conductivity than a copper interconnection unit. Due to high conductivity, surface scattering that deteriorates conductivity of the interconnection unit may be effectively prevented by a nano-scale size, for example, about 100 nm or less. The graphene interconnection unit has substantially high frequency current carrying capacity and high conductivity, such that the graphene interconnection unit is used in high-speed applications including a high frequency nanoscale circuit with improved efficiency.

In an embodiment, the graphene interconnection unit may be used as the interconnection unit in a variety of high frequency applications, for example, a semiconductor chip that operates at a high clock frequency of about 1 gigahertz (GHz) or higher, or a radio frequency "RF" or microwave circuit which operates at a high frequency of about 1 GHz or higher such as mobile phones or wireless networks. In an embodiment, the graphene interconnection unit may be used to interconnect active type devices, passive type devices and combinations thereof which operate at a high frequency of about 1 GHz or higher. In an embodiment, for example, the graphene interconnection unit may be used to interconnect field effect transistors ("FET").

In an embodiment, the graphene interconnection unit may include a single unit of graphene, e.g., a single unitary and indivisible graphene unit, or a plurality graphene units, which are aligned substantially parallel to each other on the trench.

In an embodiment of the high frequency circuit, the graphene interconnection unit connects a first electronic device and a second electronic device, where the first electronic device sends an electrical signal to the second electronic device via the graphene interconnection unit. In such an embodiment, the electrical signal may have a frequency in the range of about 1 megahertz (MHz) to about 0.8 GHz. In an alternative embodiment, the electrical signal may have a frequency in the range of about 0.8 GHz or higher, for example. In another alternative embodiment, the electrical signal may have a frequency in a range of about 2 GHz to about 300 terahertz (THz), or a frequency in a range of about 5 GHz to about 300 GHz.

In an embodiment, a method of operating the high frequency circuit may include applying a power voltage to the high frequency circuit including the graphene interconnection unit, and conveying current via the graphene interconnection unit in a high frequency field. In such an embodiment, the graphene interconnection unit may be a interconnector transistor or various electronic devices.

Figure 1B:
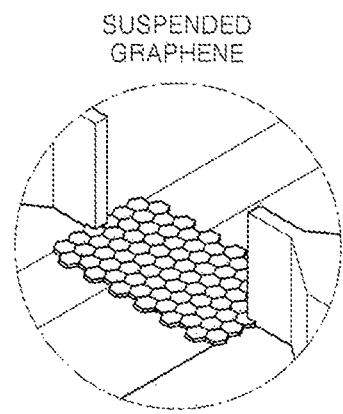
FIG. 1B is an enlarged view of portion A in FIG. 1A.
Figure 1C:
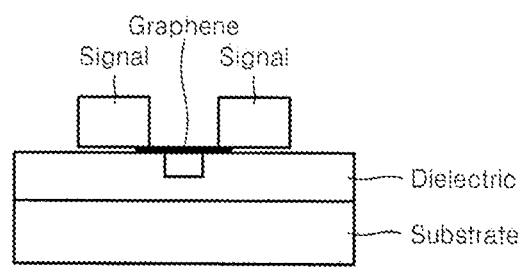
FIG. 1C is a cross-sectional view of the structure of the RF interconnection unit of FIG. 1A.

FIG. 1A is a schematic view showing a structure of an embodiment of a RF interconnection unit having a ground-signal-ground ("GSG") type electrode to measure high frequency transportation characteristics, FIG. 1B is a enlarged view of portion A in FIG. 1A, and FIG. 1C is a cross-sectional view of the structure of a RF interconnection unit of FIG. 1A.

As shown in FIGS. 1A and 1C, the trench is formed on an oxidized high resistance Si wafer having a $SiO_2$ layer with a thickness in a range of about 400 nm to about 500 nm. Ground electrodes and double-layered metallic electrodes are formed thereon using e-beam lithography and metal evaporation, graphene is disposed between the electrodes, and the trench is defined under the graphene.

Hereinafter, one or more embodiments of the invention will be described in detail with reference to the following examples. However, these examples are not intended to limit the purpose and scope of embodiments of the invention.

Example 1

A photosensitive material, e.g., AZ® 1512 (manufactured by Az Electronic Materials), was coated on an oxidized high resistance p-doped Si wafer (e.g., $\rho>10$ Ω·cm) having a $SiO_2$ layer with a thickness in a range of about 400 nm to about 500 nm to a thickness of about 1.5 µm. A pattern mask is disposed thereon and ultraviolet ("UV") rays, such as light having 436 nm wavelength ("G-line"), was irradiated thereto at about 13 milliwatts (mW) for about 3 seconds. Then, regions that were not exposed thereof were removed using an AZ® MIF 300 developer. When a predetermined shaped is formed in the photosensitive material, a trench having a width of about 5 µm, a length of about 0.5 cm, and a depth of about 30 nm was formed on the $SiO_2$ layer using a buffered oxide etchant ("BOE").

Then, a single layer graphene having a size of about 10 µm by about 10 µm, which is obtained by delamination from highly oriented pyrolytic graphite ("HOPG"), was provided on the deposited trench. Then, double-layered metallic electrodes (about 20 nm of Ti/about 1 µm of Au) were formed on the graphene using e-beam lithography and metal evaporation. As shown in FIGS. 1A and 1B, graphene is disposed between the electrodes, and the trench is disposed under the graphene and electrodes.

Example 2

An RF interconnection unit is formed in the same manner as in Example 1, except that the depth of the trench was about 60 nm.

Example 3

An RF interconnection unit is formed in the same manner as in Example 1, except that the depth of the trench was about 120 nm.

Comparative Example 1

A single layer graphene having a size of about 10 µm by about 10 µm, which is obtained by delamination from HOPG, was deposited on an oxidized high resistance p-doped Si wafer (e.g., $\rho>10$ Ω·cm) having a $SiO_2$ layer with a thickness of about 500 nm. Double-layered metallic electrodes (about 20 nm of Ti/about 100 nm of Au) were formed on the graphene by e-beam lithography and metal evaporation. The electrodes were interconnected to each other via the graphene and a distance between the electrodes was adjusted to about 5 μm.

Experimental Example 1

Transmission Characteristics Depending on Trench

Figure 2:
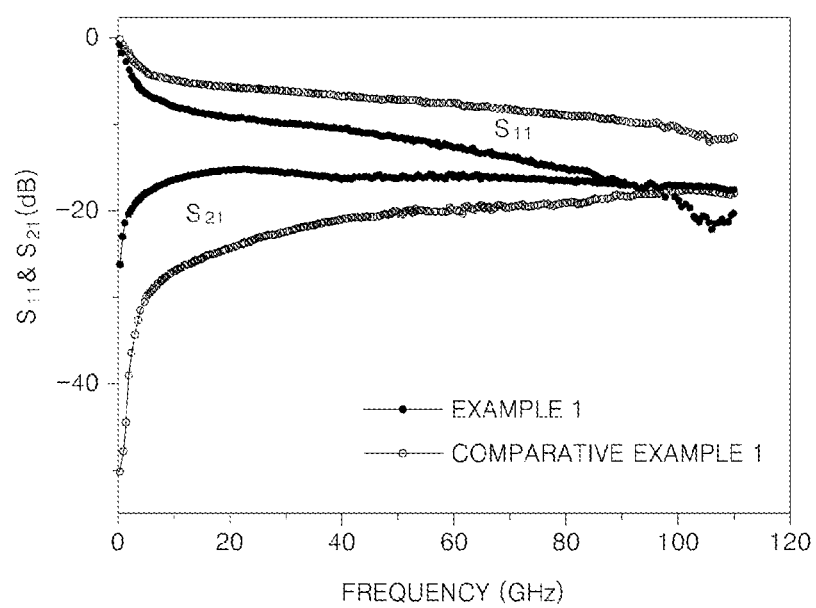
FIG. 2 is a graph illustrating S-parameters (decibel: dB) versus frequency (gigahertz: GHz) of embodiments of interconnection units prepared according to Example 1 and Comparative Example 1.

FIG. 2 is a graph illustrating S-parameters (decibel: dB) versus frequency (GHz) of an interconnection unit prepared according to Comparative Example 1, in which a trench is not formed, and embodiments of an interconnection unit prepared according to Example 1, in which a trench is formed.

S-parameters were measured using a network analyzer (Model No.: Agilent 85225HE01). GSG probes were connected to both ends of the network analyzer, and tips were closely contacted with electrodes of a sample prepared according to standard requirements. Then, a high frequency current was supplied thereto to obtain a potential difference, and then S-parameters were measured using the potential difference.

$$S_{11} = 20 \log(V1_{out}/V1_{in}) \qquad (1)$$

$$S_{21} = 20 \log(V2_{out}/V1_{in}) \qquad (2)$$

$S_{11}$ denotes a reflection coefficient, and $S_{21}$ denotes a transmission coefficient. The transmission characteristics are improved when the reflection coefficient is decreased and when the transmission coefficient is increased. Referring to the graph shown in FIG. 2, the transmission characteristics of Example 1, in which the trench is formed, were substantially improved.

Experimental Example 2

Transmission Characteristics According to Depth of Trench

Figure 3:
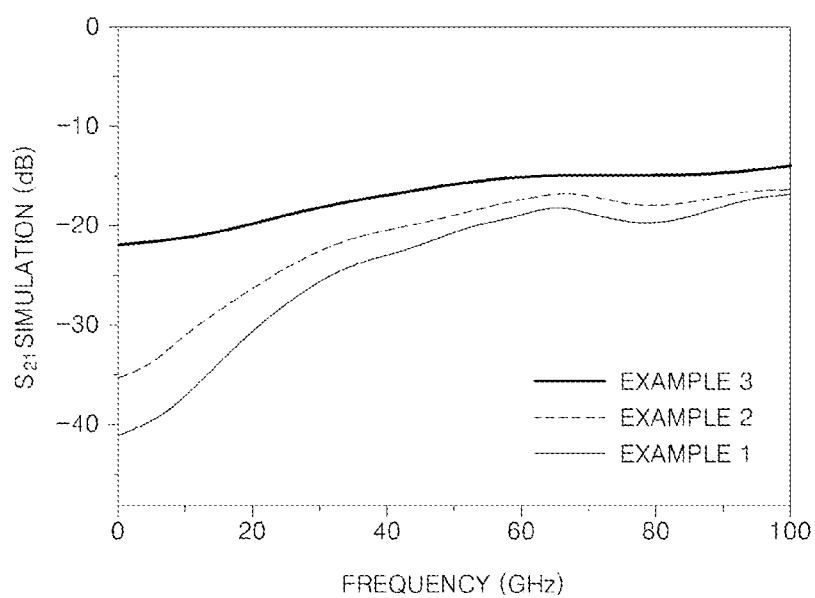
FIG. 3 is a graph illustrating S-parameters (dB) versus frequency (GHz) of embodiments of interconnection units prepared according to Examples 1 to 3.

Transmission characteristics of the RF interconnection units prepared according to Examples 1 to 3 were analyzed and the results are shown in FIG. 3.

FIG. 3 is a graph illustrating transmission coefficient of $S_{21}$ (dB) among S-parameters versus frequency. As the depth of the trench increases, transmission characteristics are improved, as shown in FIG. 3 where the interconnection unit prepared according to Example 2 or 3 has a relatively high transmission coefficient.

In an embodiment, electrical loss caused by the insulating layer is effectively prevented in a high frequency field by forming the trench or the via under the graphene interconnection unit disposed in the high frequency circuit, such that transmission characteristics may be improved. Therefore, a high frequency circuit including graphene interconnection unit and a trench or a via under the graphene interconnection unit may be substantially improved.

It should be understood that the embodiments described therein should be considered in a descriptive sense only and not for purposes of limitation. Descriptions of features or aspects within each embodiment should typically be considered as available for other similar features or aspects in other embodiments.

What is claimed is:

1. A high frequency circuit comprising:
   a first electronic device;
   a second electronic device, wherein each of the first and second electronic devices comprise a transistor; and
   a graphene interconnection unit which electrically connects and directly contacts the first and second electronic devices; and
   an insulating layer having a trench disposed under the graphene interconnection unit,
   wherein the trench has an opening portion, wherein the opening portion only extends partially through a thickness of the insulating layer,
   the graphene interconnection unit covers at least part of the opening portion,
   the graphene interconnection unit consists of solely of graphene which is disposed in the form of one graphene monolayer to 300 graphene monolayers, and
   the graphene has a planar structure in which carbon atoms are aligned in a hexagonal ring to form a honeycomb structure.

2. The high frequency circuit of claim 1, wherein the first electronic device sends an electrical signal to the second electronic device via the graphene interconnection unit in a high frequency field.

3. The high frequency circuit of claim 1, wherein the trench has a depth in the range of about 1 nanometer to about 10,000 nanometers.

4. The high frequency circuit of claim 1, wherein the first electronic device sends an electrical signal via the graphene interconnection unit at a frequency of about 0.8 gigahertz or higher.

5. The high frequency circuit of claim 1, wherein the first electronic device sends an electrical signal via the graphene interconnection unit at a frequency in a range of about 2 gigahertz to about 300 terahertz.

6. The high frequency circuit of claim 1, wherein the graphene interconnection unit comprises a plurality of graphene units aligned substantially parallel to each other.

7. The high frequency circuit of claim 1, wherein the graphene interconnection unit conveys a current at a frequency in a range of about 1 megahertz to about 800 megahertz.

8. The high frequency circuit of claim 1, wherein the graphene interconnection unit conveys a current at a frequency in a range of about 2 gigahertz to about 300 gigahertz.

9. The high frequency circuit of claim 1, wherein the high frequency circuit is a radio frequency circuit which operates at a high frequency of about 0.8 gigahertz or greater.

10. A method of operating the high frequency circuit according to claim 1, the method comprising:
    applying a power voltage to the high frequency circuit comprising the graphene interconnection unit; and
    conveying current via the graphene interconnection unit in a high frequency field,
    wherein the trench is defined under the graphene interconnection unit.

11. The high frequency circuit of claim 1, wherein the graphene has a width in a range of about 0.001 micrometer to about 1 millimeter and a length in a range of about 0.001 micrometer to about 100 micrometers.

* * * * *